(12) United States Patent
Kim et al.

(10) Patent No.: US 10,964,775 B2
(45) Date of Patent: *Mar. 30, 2021

(54) DISPLAY PANEL HAVING LOW RESISTANCE CONDUCTIVE LAYER

(71) Applicant: Samsung Display Co., Ltd., Yongin-si (KR)

(72) Inventors: Ki Hyun Kim, Pyeongtaek-si (KR); Young Gil Park, Asan-si (KR); Sung Chan Jo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/880,001

(22) Filed: May 21, 2020

(65) Prior Publication Data

US 2020/0286979 A1    Sep. 10, 2020

Related U.S. Application Data

(63) Continuation of application No. 16/121,982, filed on Sep. 5, 2018, now Pat. No. 10,692,962.

(30) Foreign Application Priority Data

Dec. 5, 2017    (KR) .......................... 10-2017-0166158

(51) Int. Cl.
*H01L 27/32*    (2006.01)
*H01L 27/12*    (2006.01)

(52) U.S. Cl.
CPC ........ *H01L 27/3279* (2013.01); *H01L 27/124* (2013.01); *H01L 27/1218* (2013.01);
(Continued)

(58) Field of Classification Search
CPC combination set(s) only.
See application file for complete search history.

(56) References Cited

U.S. PATENT DOCUMENTS 6,169,305 B1 *  1/2001  Takai ................ H01L 27/11502
                                                      257/295
7,417,249 B2    8/2008  Akimoto et al.
(Continued)

FOREIGN PATENT DOCUMENTS

JP        2850850        1/1999
KR     10-0560792        3/2006
(Continued)

OTHER PUBLICATIONS

M. D. Banus et al., "Electrical and Magnetic Properties of TiO and VO", Physical Review B, vol. 5, No. 8, 1972.
(Continued)

*Primary Examiner* — Nduka E Ojeh
(74) *Attorney, Agent, or Firm* — Kile Park Reed & Houtteman PLLC

(57) ABSTRACT

A display panel having a low-resistance conductive layers is disclosed. An example display panel includes a first conductive layer having a first layer, a second layer, a third layer, a fourth layer, and a fifth layer that are sequentially stacked with the first layer being electrically conductive with the fifth layer, and a second conductive layer that is disposed on the first conductive layer and that in contact with the fifth layer. The first layer and the third layer include a first metal. Further, the second layer includes a second metal that is different from the first metal. Still further, the fourth layer includes the first metal and oxygen in a first composition ratio, and the fifth layer includes the first metal and oxygen (Continued)

in a second composition ratio with the first composition ratio and the second composition ratio being different from each other.

20 Claims, 10 Drawing Sheets

(52) U.S. Cl.
CPC ...... *H01L 27/3248* (2013.01); *H01L 27/3258* (2013.01); *H01L 27/3262* (2013.01); *H01L 27/1255* (2013.01); *H01L 2227/323* (2013.01)

(56) References Cited

U.S. PATENT DOCUMENTS

| | | |
|---|---|---|
| 9,576,984 B1 | 2/2017 | Shih et al. |
| 2003/0201716 A1* | 10/2003 | Yamazaki ............. H01L 27/322 |
| | | 313/506 |
| 2010/0181592 A1 | 7/2010 | Yamazaki et al. |
| 2011/0121302 A1* | 5/2011 | Lee ..................... H01L 27/3262 |
| | | 257/59 |
| 2014/0054584 A1 | 2/2014 | Sunamura et al. |
| 2014/0361261 A1 | 12/2014 | Choi et al. |
| 2016/0351851 A1 | 12/2016 | Lee et al. |
| 2017/0222052 A1 | 8/2017 | Weber et al. |
| 2018/0366533 A1 | 12/2018 | Lee et al. |

FOREIGN PATENT DOCUMENTS

| | | |
|---|---|---|
| KR | 10-0623252 | 9/2006 |
| KR | 10-0764773 | 10/2007 |
| KR | 10-2008-0098941 | 11/2008 |
| WO | 2017/045135 | 3/2017 |

OTHER PUBLICATIONS

Stephen Paul Denker, "Electronic Properties of Titanium Monoxide", Journal of Applied Physics, vol. 37, No. 1, 1966.
Extended European Search Report corresponding to European Application or Patent No. 18 20 8755.1 dated May 13, 2019.

* cited by examiner

DISPLAY PANEL HAVING LOW RESISTANCE CONDUCTIVE LAYER

CROSS-REFERENCE TO RELATED APPLICATION(S)

This is a continuation application based on currently pending U.S. patent application Ser. No. 16/121,982, filed on Sep. 5, 2018, the disclosure of which is incorporated herein by reference in its entirety. U.S. patent application Ser. No. 16/121,982 claims priority benefit of Korean Patent Application No. 10-2017-0166158, filed on Dec. 5, 2017 in the Korean Intellectual Property Office, the disclosure of which is incorporated herein by reference in its entirety for all purposes.

BACKGROUND

1. Field

Embodiments relate to a display panel and a manufacturing method thereof.

2. Description of the Related Art

A display device such as a liquid crystal display (LCD) and an organic light emitting diode (OLED) display includes a display panel including a plurality of pixels displaying images, and a plurality of signal lines. Each pixel may include a pixel electrode receiving a data signal, and the pixel electrode may be connected to at least one transistor to receive the data signal.

The above information disclosed in this Background section is only for enhancement of understanding of the background of the invention and therefore it may contain information that does not form the prior art that is already known in this country to a person of ordinary skill in the art.

SUMMARY

Embodiments are directed to a display panel including a first conductive layer including a first layer, a second layer, and a third layer that are sequentially stacked, and a second conductive layer on the first conductive layer and in contact with the third layer. The first layer includes a first metal. The second layer includes the first metal and oxygen in a first composition ratio. The third layer includes the first metal and oxygen at a second composition ratio. The first composition ratio and the second composition ratio are different from each other. Conductivity of the third layer is higher than conductivity of the second layer.

The first composition ratio is a ratio of an atom percent of the first metal to an atom percent of oxygen in the second layer. The second composition ratio is a ratio of an atom percent of the first metal to an atom percent of oxygen in the third layer. The second composition ratio is smaller than the first composition ratio.

The first composition ratio may be more than 1.0 and less than or equal to 2.0. The second composition ratio may be equal to or more than 0.8 and less than or equal to 1.0.

The second layer may be amorphous, and the third layer may be crystalline.

An atom percent of oxygen included in the first layer may be lower than an atom percent of oxygen included in the second layer.

The display panel may further include a substrate under the first conductive layer and an underlying layer between the substrate and the first conductive layer. The first conductive layer may further include a fourth layer and a fifth layer under the first layer. The fifth layer may be between the first layer and the fourth layer. The fifth layer may include a second metal that is different from the first metal. The fourth layer may include the first metal. The fourth layer may contact the underlying layer.

The atom percent of oxygen included in the first layer may be between the atom percent of oxygen included in the second layer and an atom percent of oxygen included in the fourth layer.

A thickness of the fifth layer may be greater than a thickness of the first layer or the fourth layer.

The first metal may be titanium (Ti).

The display panel may further include an insulating layer between the first conductive layer and the second conductive layer. The insulating layer may include a contact hole on the first conductive layer. The third layer may include a first portion and a second portion, the first portion being located corresponding to the contact hole and not overlapping the insulating layer, the second portion being connected to the first portion and located between the insulating layer and the second layer. A thickness of the second portion may be equal to or less than a thickness of the first portion.

The thickness of the second portion may gradually decrease in relation to a distance from the first portion.

The display panel may further include an insulating layer between the first conductive layer and the second conductive layer. The insulating layer may include a contact hole on the first conductive layer. The third layer may be located at an area corresponding to the contact hole.

The display panel may further include a substrate under the first conductive layer, an active layer between the substrate and the first conductive layer and including a semiconductor material, at least one first insulating layer between the active layer and the first conductive layer, and a second insulating layer between the first conductive layer and the second conductive layer. The first conductive layer may be electrically connected to the active layer through a first contact hole included in the at least one first insulating layer. The second conductive layer may contact the third layer through a second contact hole included in the second insulating layer.

Embodiments are also directed to a display panel including a first conductive layer including a first layer, and a third layer disposed on the first layer, a second conductive layer on the first conductive layer, and an organic insulating layer between the first conductive layer and the second conductive layer. The first conductive layer may further includes a second layer between the first layer and the third layer. The first layer may include a first metal. The second layer and the third layer may include the first metal and oxygen. The second layer may be amorphous, and the third layer may be crystalline.

A second composition ratio as a ratio of an atom percent of the first metal to an atom percent of oxygen included in the third layer is smaller than a first composition ratio as a ratio of an atom percent of the first metal to an atom percent of oxygen included in the second layer.

The first composition ratio may be more than 1.0 and less than or equal to 2.0. The second composition ratio may be equal to or greater than 0.8 and less than or equal to 1.0.

The organic insulating layer includes a contact hole. The third layer may include a first portion and a second portion. The first portion may be located corresponding to the contact hole and not overlapping the organic insulating layer. The second portion may be connected to the first portion and located between the organic insulating layer and the second layer. A thickness of the second portion may be less than a thickness of the first portion.

The thickness of the second portion may gradually decrease in relation to a distance from the first portion.

Embodiments are also directed to a display panel including a first conductive layer including a first layer, a second layer, and a third layer that are sequentially stacked and a second conductive layer on the first conductive layer, the second conductive layer contacting the third layer. The first layer includes titanium. The second layer and the third layer include titanium and oxygen. A first composition ratio as a ratio of an atom percent of titanium to an atom percent of oxygen included in the second layer is larger than 1.0. A second composition ratio as a ratio of the atom percent of titanium to the atom percent of oxygen included in the third layer is less 1.0.

Embodiments are also directed to a method for manufacturing a display panel including forming a plurality of layers including a first insulating layer on a substrate, sequentially stacking a first layer, a second layer, and a third layer that include a first metal on the first insulating layer, coating an organic material on a fourth layer as an oxidation layer formed on the third layer and executing a photo process to form a passivation layer having a contact hole on the fourth layer, and curing the passivation layer in a nitrogen ($N_2$) atmosphere and at a predetermined temperature to form a fifth layer that is crystalline and disposed on the fourth layer, the fourth layer being amorphous.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
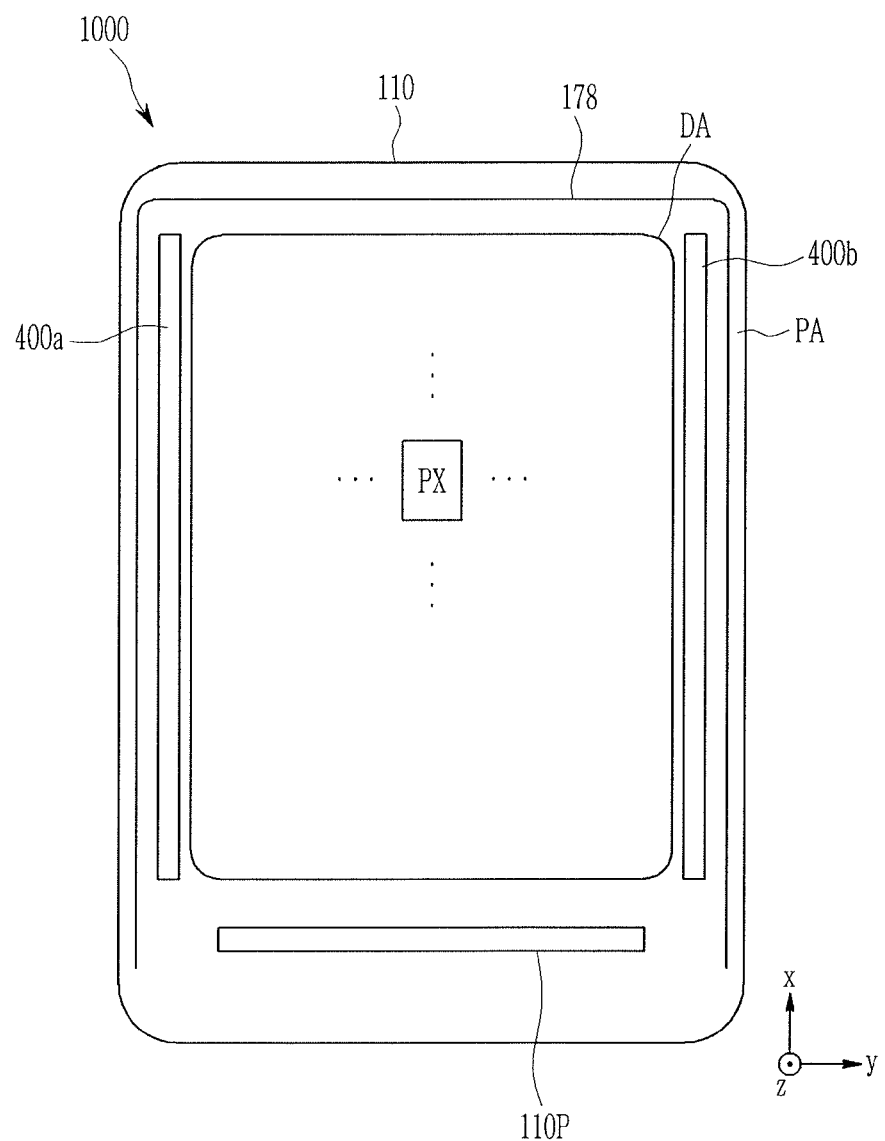
FIG. 1 illustrates a schematic plane layout view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Further, in the specification, the word "on" or "above" means positioned on or below the object portion, and does not necessarily mean positioned on the upper side of the object portion based on a gravitational direction.

Referring to FIG. 1, the display panel 1000 according to an exemplary embodiment includes a substrate 110 including a display area DA as an area displaying an image in a plan view and a peripheral area PA disposed outside the display area DA. The peripheral area PA may not display an image, or may include an area displaying the image, as desired.

The substrate 110 may include an insulating material such as a plastic, a metal thin film, and a thin glass film. The substrate 110 may be a flexible substrate or may be a substantially rigid substrate. The substrate 110 may include a single layer or a plurality of layers. When the substrate 110 includes a plurality of layers, the substrate 110 may include at least one base layer including a polymer such as a polyimide, and at least one barrier layer including a silicon oxide, a silicon nitride, etc. The base layer and the barrier layer may be alternately stacked.

The display area DA may include a plurality of pixels PX and a plurality of signal lines. The display area DA may display the image on the surface parallel to the x direction and the y direction. The pixel PX may include at least one switching element and a pixel electrode connected thereto. The switching element may be a three-terminal element such as a transistor that is integrated in the display panel 1000. The pixel electrode may selectively receive a data signal through at least one switching element.

The peripheral area PA may include a circuit such as gate drivers 400a and 400b, a signal line such as a voltage transmitting line 178, a pad portion 110P, etc.

The gate driver 400a and the gate driver 400b may be disposed in the peripheral area PA at right and left sides of the display area DA. Each of the gate drivers 400a and 400b may include a plurality of stages sequentially arranged in a direction approximately parallel to the x direction. The gate drivers 400a and 400b may be directly formed on the substrate 110 along with the plurality of signal lines and the switching element that are disposed in the display area DA. One of the two gate drivers 400a and 400b may be omitted.

The voltage transmitting line 178 may extend along at least three edges such as left, right, and upper edges of the display area DA. The voltage transmitting line 178 may transmit a predetermined voltage such as a common voltage ELVSS to the display area DA.

The pad portion 110P may be disposed at one side in a peripheral area PA (e.g., a lower side peripheral area PA) with respect to the display area DA. The pad portion 110P may include a plurality of pads for connecting an IC chip, a circuit film, etc. End portions of the signal lines disposed in the peripheral area PA may be connected to the pad portion 110P to receive the signal.

Figure 2:
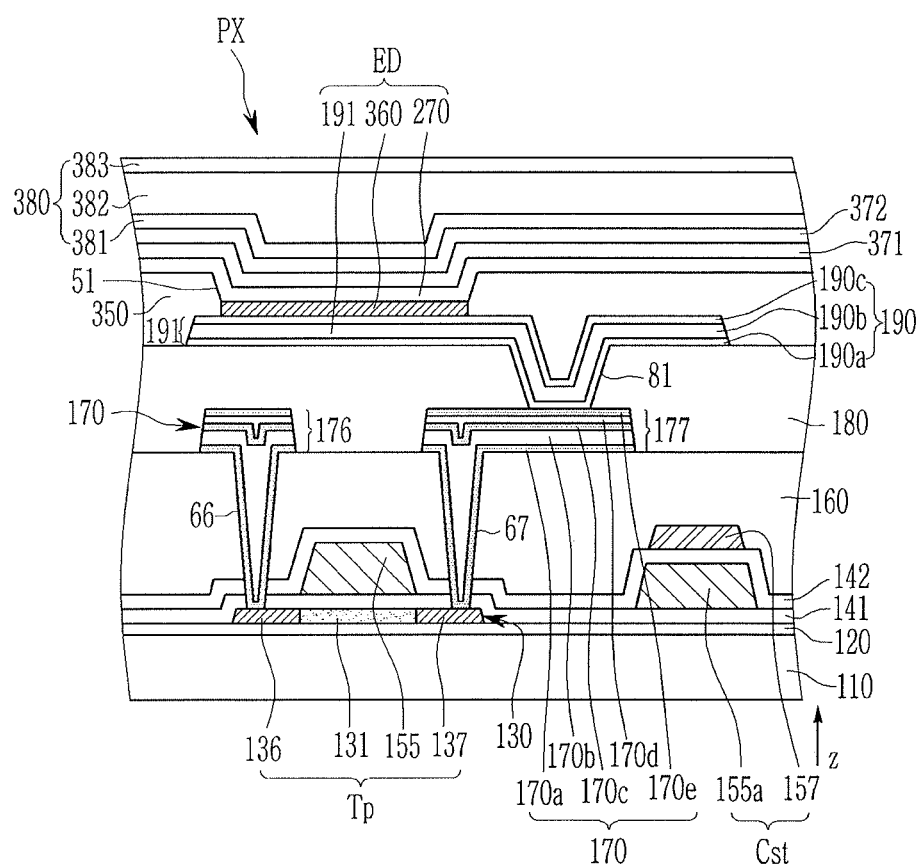
FIG. 2 illustrates a cross-sectional view around a pixel disposed in a display area of a display device according to an exemplary embodiment.

Referring to a cross-sectional view, a structure including a lower conductive layer including at least three layers that are sequentially stacked and an upper conductive layer disposed thereon and in contact with an uppermost layer of the lower conductive layer may be disposed in the display area DA and/or the peripheral area PA of the display panel 1000. FIG. 2 illustrates the cross-sectional structure of the pixel PX as an example in which this structure is disposed in the display area DA, and FIG. 3 illustrates the cross-sectional structure of the transistor circuit and the signal line as an example in which this structure is disposed in the peripheral area PA.

Figure 3:
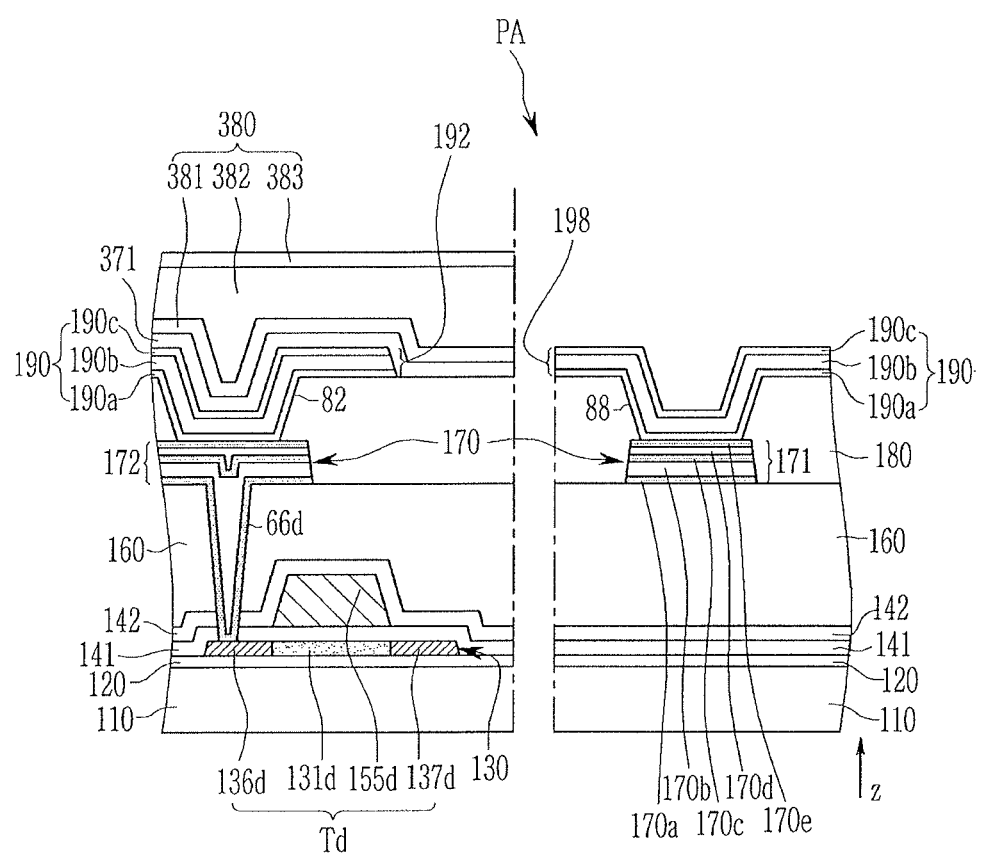
FIG. 3 illustrates a cross-sectional view of a peripheral area of a display device according to an exemplary embodiment.

Referring to FIG. 1 to FIG. 3, the display panel 1000 according to an exemplary embodiment may include at least one transistor Tp, a capacitor Cst and at least one light emitting diode (LED) ED that are disposed in one pixel PX, and at least one transistor Td disposed in the peripheral area PA.

Referring to the cross-sectional structure in detail, a barrier layer 120 made of the plurality of layers or the single layer may be disposed on the substrate 110, and a plurality of active patterns 130 may be disposed on the barrier layer 120. (Herein, an active pattern 130 may be referred to variously as an active layer or as an active pattern.) The plurality of active patterns 130 may include source areas 136 and 136d and drain areas 137 and 137d, and channel areas 131 and 131d disposed between the source areas 136 and 136d and the drain areas 137 and 137d facing each other. The active pattern 130 may include a semiconductor material such as amorphous silicon, a polysilicon, an oxide semiconductor, etc. A part of the active pattern 130, such as the channel areas 131 and 131d, may maintain a semiconductor characteristic, and other parts, such as the source areas 136 and 136d and the drain areas 137 and 137d, may have conductivity.

A first insulating layer 141 may be disposed on the active pattern 130, and a first conductive layer including gate electrodes 155 and 155d and a first electrode 155a may be disposed on the first insulating layer 141. The active pattern 130 and the gate electrodes 155 and 155d overlapping thereto may form respective ones of the transistors Tp and Td. The transistor Tp disposed in the pixel PX may include the channel area 131, the source area 136, and the drain area 137, and the gate electrode 155 overlapping the channel area 131. The transistor Td disposed in the peripheral area PA may include the channel area 131d, the source area 136d, and the drain area 137d, and the gate electrode 155d overlapping the channel area 131d. The transistor Td may be included in a circuit such as the gate drivers 400a and 400b.

A second insulating layer 142 may be disposed on the first conductive layer and the first insulating layer 141, and a second conductive layer including a second electrode 157 may be disposed on the second insulating layer 142. The first electrode 155a and the second electrode 157 overlapping each other, with the second insulating layer 142 in between, may form the capacitor Cst. The first electrode 155a may be connected to the gate electrode of another transistor included in the pixel PX. In this case, the capacitor Cst may function to maintain the voltage of the gate electrode connected to the first electrode 155a. The second electrode 157 may receive a predetermined voltage such as a driving voltage.

A third insulating layer 160 may be disposed on the second conductive layer and the second insulating layer 142.

At least one among the barrier layer 120, the first insulating layer 141, the second insulating layer 142, and the third insulating layer 160 may include an inorganic insulating material such as a silicon nitride ($SiN_x$), a silicon oxide ($SiO_x$), a silicon oxynitride (SiON), and/or an organic insulating material. Some or all of the first insulating layer 141, the second insulating layer 142, and the third insulating layer 160 may have a plurality of contact holes 66, 66d, and 67.

A third conductive layer 170 corresponding to the above-described lower conductive layer may be disposed on the third insulating layer 160. The third conductive layer 170 may include a plurality of connection electrodes 172, 176, and 177 and a plurality of signal lines 171. The plurality of signal lines 171 may include signal lines transmitting the various signals or voltages such as the voltage transmitting line 178, the data line transmitting the data voltage, and the driving voltage line transmitting the driving voltage.

In the display area DA, the connection electrode 176 may be electrically connected to the source area 136 of the transistor Tp through the contact hole 66, and the connection electrode 177 may be electrically connected to the drain area 137 of the transistor Tp through the contact hole 67. In the peripheral area PA, the connection electrode 172 may be electrically connected to the source area 136d of the transistor Td through the contact hole 66d. The connection electrode 176 may be omitted.

At least one among the first conductive layer, the second conductive layer, and the third conductive layer 170 may include the conductive material such as a metal of copper (Cu), silver (Ag), aluminum (Al), molybdenum (Mo), titanium (Ti), and tantalum (Ta), and/or an alloy of at least two among them.

For example, according to the present exemplary embodiment, the third conductive layer 170 may include a plurality of layers for optimizing the characteristics of the display panel 1000. The third conductive layer 170 may include a first layer 170a, a second layer 170b, a third layer 170c, a third layer 170d, and a fifth layer 170e that are sequentially stacked in the upper direction with respect to the substrate 110. The prefixes 'first', 'second', etc. used here are not intended to define a stacking order of layers, but to distinguish the layers, and may be used in other ways in other parts of the detailed description or in the claims.

The third layer 170c, the fourth layer 170d, and the fifth layer 170e may commonly include the first metal. The fourth layer 170d and the fifth layer 170e may include oxygen of a higher content ratio (e.g., a higher atom percent (at %)) than the third layer 170c. The atom percent of oxygen included in the first layer 170a may be similar to the atom percent of oxygen included in the third layer 170c. The atom percent of oxygen included in the third layer 170c may be between the atom percent of oxygen included in the fourth layer 170d and the atom percent of oxygen included in the first layer 170a. The fourth layer 170d and the fifth layer 170e may be layers formed by oxidizing the first metal included in the third layer 170c. The fourth layer 170d may include the first metal and oxygen of a first composition ratio, the fifth layer 170e may include the first metal and oxygen of a second composition ratio. The first composition ratio and the second composition ratio may be different from each other. The first composition ratio is the ratio (the first metal (at %)/oxygen (at %)) of the atom percent of the first metal with respect to the atom percent of oxygen included in the fourth layer 170d. The second composition ratio is the ratio (the first metal (at %)/oxygen (at %)) of the atom percent of the first metal with respect to the atom percent of oxygen included in the fifth layer 170e.

The fifth layer 170e may have higher conductivity than the fourth layer 170d. The fourth layer 170d may be amorphous, and the fifth layer 170e may be crystalline. The fourth layer 170d may be a natural oxidation layer generated by naturally oxidizing the first metal included in the third layer 170c. The fifth layer 170e may be formed by crystallizing a part of the fourth layer 170d. This will be explained in more detail below.

The first metal may include at least one among titanium (Ti), chromium (Cr), tantalum (Ta), molybdenum (Mo), tungsten (W), neodymium (Nb), gold (Au), or alloys thereof. For example, when the first metal is titanium (Ti), the fourth layer 170d may be made of a titanium oxide ($TiO_x$, where x is from 0.5 to 0.9), the fifth layer 170e may be titanium monoxide ($TiO_x$, where x is from 0.8 to 1.0), and the fifth layer 170e may have higher conductivity than the fourth layer 170d.

When the first metal is titanium (Ti), the crystalline structure of the fifth layer 170e may be a cubic structure.

When the first metal is titanium (Ti), the second composition ratio may be smaller than the first composition ratio. In detail, the first composition ratio may be larger than 1.0 (excess) and equal to or less than 2.0, and the second composition ratio may be equal to or greater than 0.8 and equal to or less than 1.0.

Among the layers of the third conductive layer 170, the ratio with respect to the thickness of the fifth layer 170e in a sum of the thicknesses of the fourth layer 170d and the fifth layer 170e may be 50% or more. For example, the sum of the thicknesses of the fourth layer 170d and the fifth layer 170e may be about 30 angstroms to about 100 angstroms. In this case, each thickness of the fourth layer 170d and the fifth layer 170e may be about 15 angstroms to about 40 angstroms.

As above-described, the fourth layer 170d and the fifth layer 170e having the higher oxygen content ratio (atom percent) than the third layer 170c may be disposed on the third layer 170c. In some implementations, the first layer 170a having a similar composition ratio to the third layer 170c may be in direct contact with another underlying layer. For example, as shown in FIG. 2, the first layer 170a included in the connection electrodes 176 and 177 may be in direct contact with the third insulating layer 160 or the source/drain area 136/137 of the transistor Tp. As another example, as shown in FIG. 3, the first layer 170a included in the connection electrode 172 and the signal line 171 may be in direct contact with the third insulating layer 160 or the source area 136d of the transistor Td.

The second layer 170b may include a second metal that is different from the first metal. The second metal may include aluminum (Al) or an aluminum alloy. The conductivity of the second metal may higher than the conductivity of the first metal.

The thickness of the second layer 170b may be greater than the thickness of the first layer 170a or the third layer 170c. Unless stated otherwise, the term "thickness" refers to a thickness in a direction perpendicular to the upper surface of the substrate 110, that is, the z direction.

The first layer 170a and the third layer 170c may prevent a reaction with other layers (e.g., the active pattern 130, the third insulating layer 160, or a passivation layer 180 and a fourth conductive layer 190 described below) disposed on or under the third conductive layer 170 and/or may prevent impurities from penetrating into the second layer 170b, thereby preventing the third conductive layer 170 from being corroded. Accordingly, a contact characteristic of the third conductive layer 170 with the other layers may be improved.

The passivation layer 180 as a fourth insulating layer may be disposed on the third conductive layer 170 and the third insulating layer 160. The passivation layer 180 may have a contact hole 81 exposing the connection electrode 177, a contact hole 82 exposing the connection electrode 172, and a contact hole 88 exposing the signal line 171. The contact hole 88 may expose a part (e.g., the end portion of the signal line 171) of the signal line 171 to not be covered. The passivation layer 180 may include the inorganic insulating material and/or the organic insulating material such as a polyacryl-based resin and a polyimide-based resin. The upper surface of the passivation layer 180 may be substantially flat.

The fourth conductive layer 190, including a pixel electrode 191, a connecting member 192, and a contact assistant 198, may be disposed on the passivation layer 180.

The pixel electrode 191 may be disposed in each pixel PX of the display area DA, and may be connected to the connection electrode 177 through the contact hole 81, thereby receiving the data voltage. The connecting member 192 may be disposed in the peripheral area PA and may be connected to the connection electrode 172 through the contact hole 82, thereby electrically connecting the transistor Td to another electrode or transistor. The contact assistant 198 may be disposed in the peripheral area PA, and may be electrically connected to the signal line 171 through the contact hole 88. The contact assistant 198 may prevent the corrosion of the end portion of the signal line 171 that is not covered by the passivation layer 180, and may assist with adhesion between a bump such as the IC chip or the printed circuit film and the signal line 171. The end portion of the signal line 171 and the contact assistant 198 may be disposed in the pad portion 110P shown in FIG. 1, for example.

The fourth conductive layer 190 may include a semi-transmissive conductive material layer or a reflective conductive material, as examples.

The fourth conductive layer 190 may include a single layer or a plurality of layers. When the fourth conductive layer 190 includes the plurality of layers, the fourth conductive layer 190 may include a first layer 190a, a second layer 190b, and a third layer 190c that are sequentially stacked in the upper direction with respect to the substrate 110. The second layer 190b may include, for example, silver (Ag), and the first layer 190a and the third layer 190c may include, for example, ITO, etc. The first layer 190a and the third layer 190c may prevent the corrosion of the second layer 190b and may increase adherence of the fourth conductive layer 190 with another layer.

A pixel definition layer 350 may be disposed on the passivation layer 180. The pixel definition layer 350 may have an opening (also referred to as a hole) 51 disposed on the pixel electrode 191. The pixel definition layer 350 may be removed in the opening 51, such that the pixel electrode 191 is not covered by the pixel definition layer 350 and is exposed. The pixel definition layer 350 may include a photosensitive organic material such as polyacryl-based resin, a polyimide-based resin, etc.

An emission layer 360 may be disposed on the pixel electrode 191. The emission layer 360 may include a portion exposed in the opening 51 of the pixel definition layer 350. The emission layer 360 may include an organic emission material or an inorganic emission material.

A common electrode 270 may be disposed on the emission layer 360. The common electrode 270 may also be formed on the pixel definition layer 350, thereby being continuously formed throughout the plurality of pixels PX. The common electrode 270 may include, for example, a conductive transparent material.

The pixel electrode 191, the emission layer 360, and the common electrode 270 in each pixel PX may together the light emitting diode (LED) (ED).

A capping layer 371 and/or a functional layer 372 may be disposed on the common electrode 270. The capping layer 371 may play a role of increasing light efficiency through a refractive index adjustment. The functional layer 372 may play a role of increasing the light efficiency by preventing damage to the underlying layers. The functional layer 372 and the capping layer 371 may be omitted in at least part of the peripheral area PA. For example, as shown in the left side and the right side of FIG. 3, the capping layer 371 may be disposed only in part of the peripheral area PA and the functional layer 372 may be omitted. As shown, for example, at the right side of FIG. 3, the capping layer 371 and the functional layer 372 may be omitted in some parts.

An encapsulation layer 380 may be disposed on the functional layer 372. The encapsulation layer 380 may encapsulate the light emitting diode (LED) (ED), thereby preventing moisture or oxygen from penetrating from the outside. The encapsulation layer 380 may include at least one of inorganic layers 381 and 383 including an inorganic material, and at least one organic layer 382 including an organic material. The inorganic layers 381 and 383 and the organic layer 382 may be alternately stacked. According to another exemplary embodiment, the encapsulation layer 380 may be another substrate facing the substrate 110.

The third conductive layer 170 will be described in detail with reference to FIG. 4 to FIG. 7 along with FIG. 1 to FIG. 3.

Figure 4:
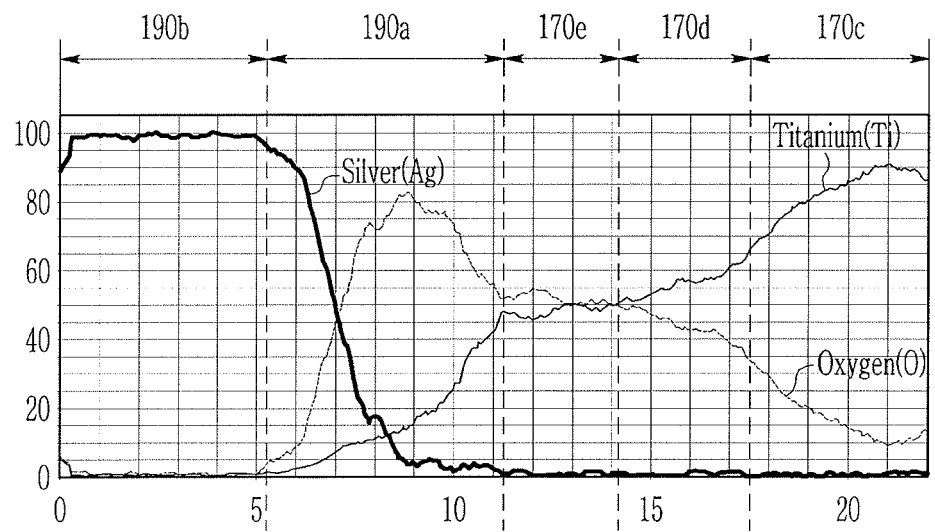
FIG. 4 illustrates a graph showing an element content ratio (atom percent) change of conductive layers of a display device according to an exemplary embodiment.

FIG. 4 shows a graph representing the content ratio (at %) change of elements included in a part of the third conductive layer 170 including titanium (Ti) and a part of the fourth conductive layer 190 including silver (Ag) and ITO as the first metal.

Referring to FIG. 4, most of the third layer 170c is made of titanium, and the atom percent of titanium is generally lower going from the third layer 170c to the fourth layer 170d and the fifth layer 170e, and the first layer 190a and the second layer 190b of the fourth conductive layer. The word "most" as used herein indicates more than 90% of the entirety. The atom percent of oxygen (O) is generally higher going from the third layer 170c to the fourth layer 170d and the fifth layer 170e. For example, the first composition ratio as the ratio of the atom percent (at %) of titanium to the atom percent (at %) of oxygen included in the fourth layer 170d is larger than about 1.0 (excess) and less than or equal to about 2.0. The second composition ratio as the ratio of the atom percent (at %) of titanium to the atom percent (at %) of oxygen included in the fifth layer 170e is greater than or equal to about 0.8 and less than or equal to 1.0 or less.

Figure 5:
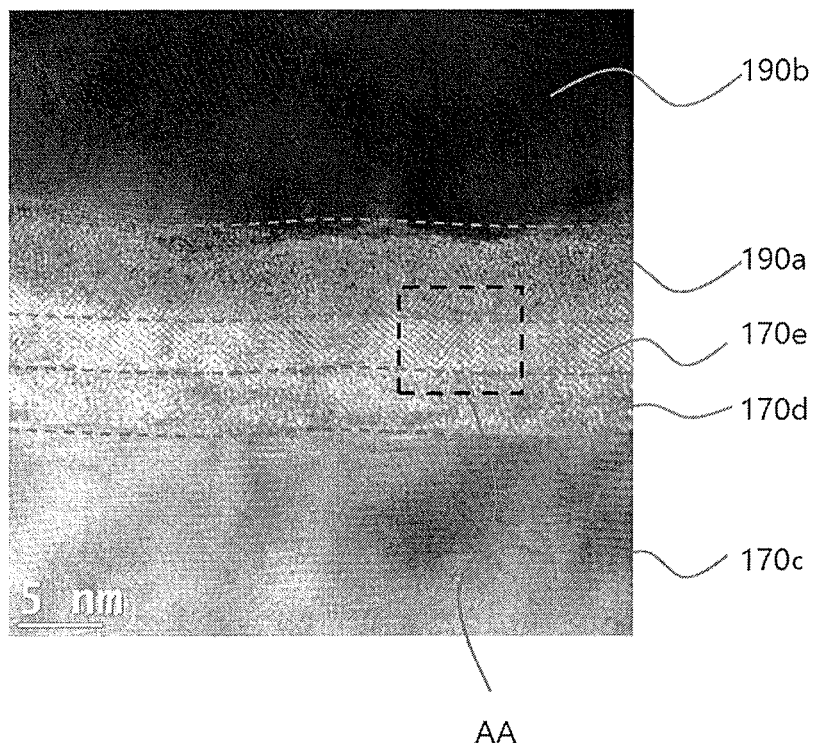
FIG. 5 illustrates a cross-sectional image of conductive layers of a display device according to an exemplary embodiment.
Figure 6:
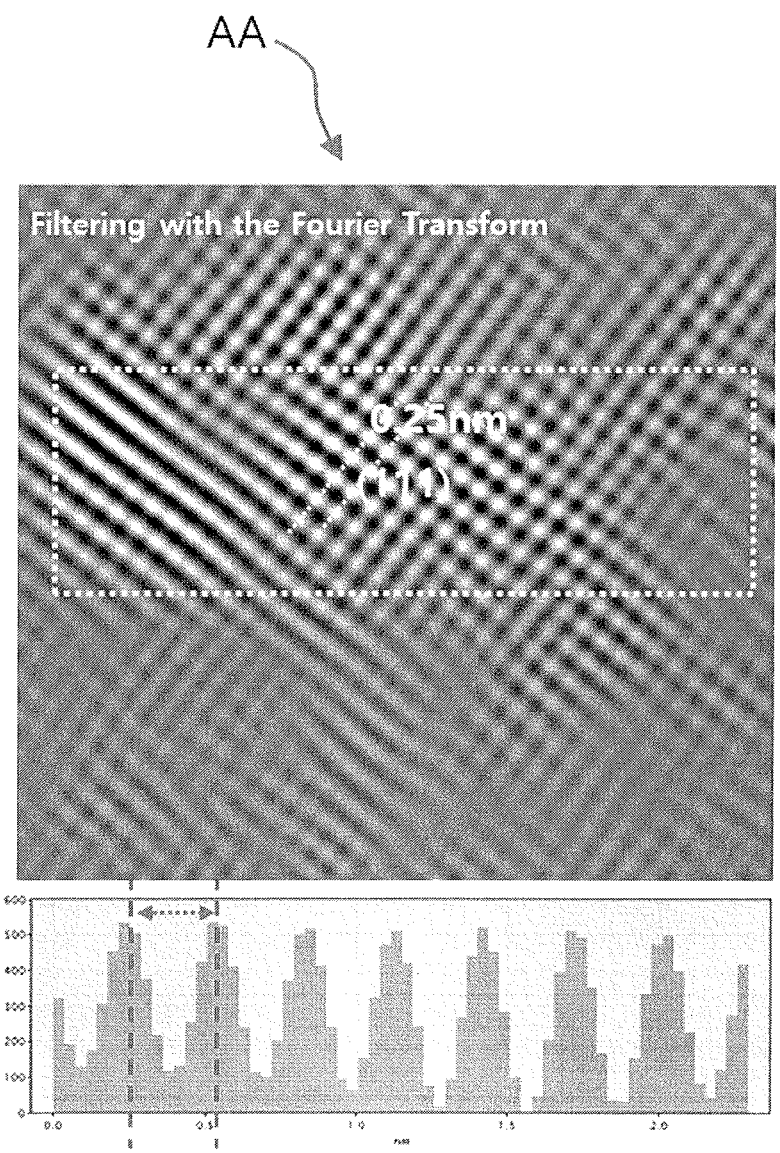
FIG. 6 illustrates a refraction photo filtering of an AA area of the image shown in FIG. 5 by using Fourier transform.

FIG. 5 illustrates a cross-sectional image of conductive layers of a display device according to an exemplary embodiment, and FIG. 6 illustrates a refraction photo filtering an AA area of the image shown in FIG. 5 by using Fourier transform.

As above-described, the fourth layer 170d is a natural oxidation layer that is generated when titanium included in the third layer 170c is naturally oxidized. In FIG. 5, a boundary between the third layer 170c and the fourth layer 170d may be confirmed. The fifth layer 170e is a layer formed by crystallizing part of the fourth layer 170d as the natural oxidation layer of titanium. A boundary may also be confirmed between the fourth layer 170d and the fifth layer 170e. For example, as shown in the refraction image of FIG. 6, the crystallized fifth layer 170e may have the cubic structure.

As shown in the several structures shown in FIG. 2 and FIG. 3, the third conductive layer 170 may be in contact with the fourth conductive layer 190 while another conductive layer and transmits a voltage. If the contact resistance between the third conductive layer 170 and the fourth conductive layer 190 is high, the voltage could decrease such that a failure of the display could be generated. For example, it may be difficult to remove the fourth layer 170d of the third conductive layer 170 as the natural oxidation layer and the contact resistance may be increased. However, according to an exemplary embodiment, the fifth layer 170e may be disposed between the fourth layer 170d and the fourth conductive layer 190, thereby decreasing the contact resistance. This effect may be confirmed in the graph illustrated in FIG. 7.

Figure 7:
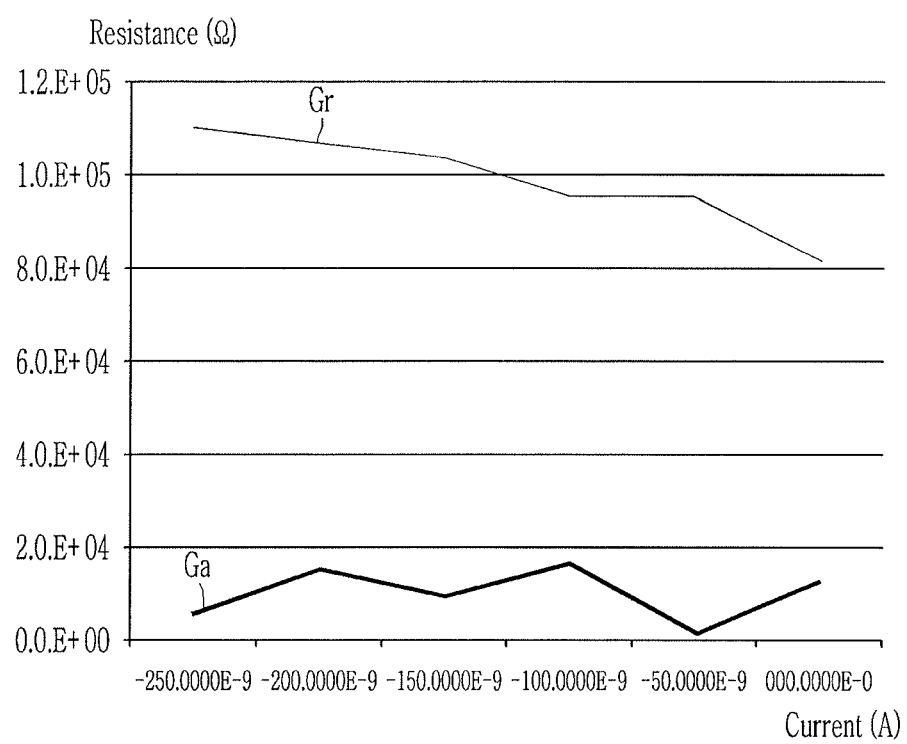
FIG. 7 illustrates a graph showing contact resistance between conductive layers according to an exemplary embodiment and contact resistance between conductive layers according to a comparative example.

A first curve Ga shown in FIG. 7 represents the contact resistance between the third conductive layer 170 of which the first metal is titanium and the fourth conductive layer 190 in the structure according to an exemplary embodiment. As a comparative example, the second curve Gr represents the contact resistance between the third conductive layer and the fourth conductive layer when the fifth layer 170e of the third conductive layer 170 does not exist. The resistance represented by the second curve Gr is from about 80 kΩ to about 110 kΩ, and the resistance represented by the first curve Ga is from about 1 kΩ to about 15 kΩ. In the structure according to an exemplary embodiment, it may be found that the contact resistance between the third conductive layer 170 and the fourth conductive layer 190 is lower by about one hundred to several hundreds compared to the contact resistance of the comparative example. Therefore, according to the exemplary embodiments, a reduction of the voltage transmitted from the third conductive layer 170 to the fourth conductive layer 190 may be prevented, thereby reducing defects of the display.

Now, the structure of the third conductive layer included in the display panel according to an exemplary embodiment will be described with reference to FIG. 8 to FIG. 10 along with the above-described drawings.

Figure 8:
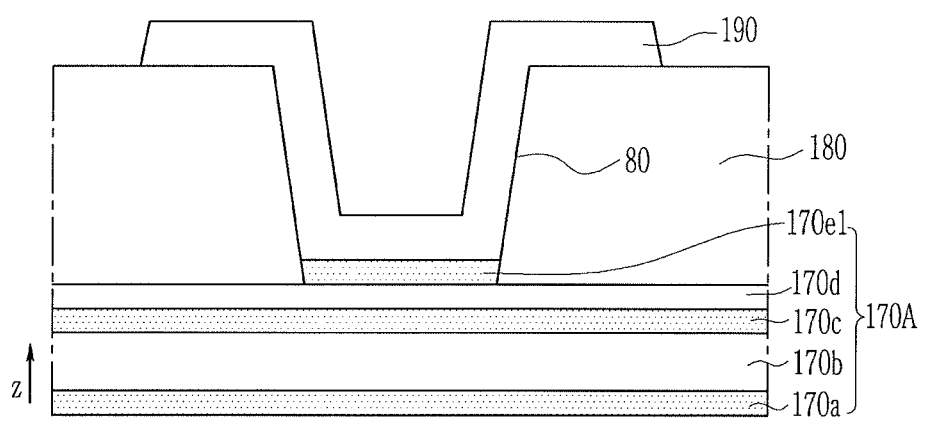
FIG. 8, FIG. 9, and FIG. 10 are a cross-sectional view of a display device according to respective exemplary embodiments.
Figure 9:
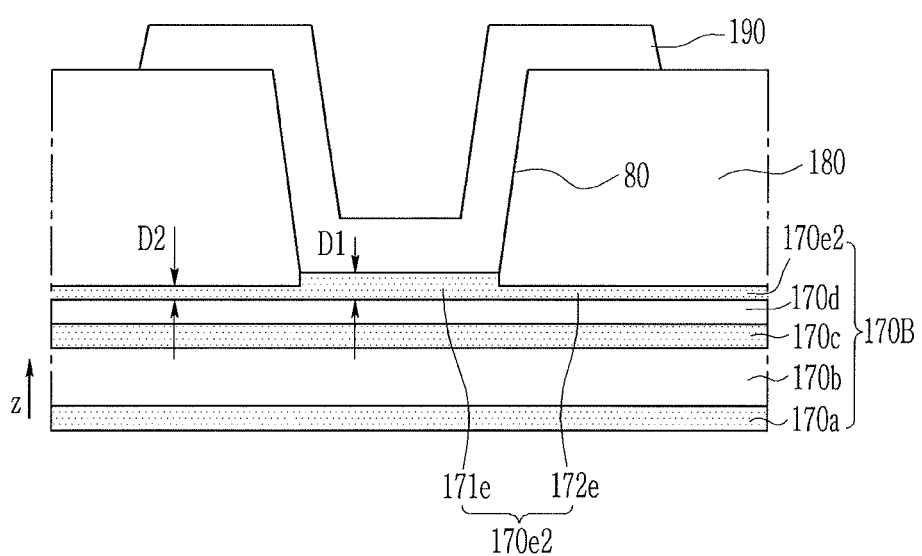
Figure 10:
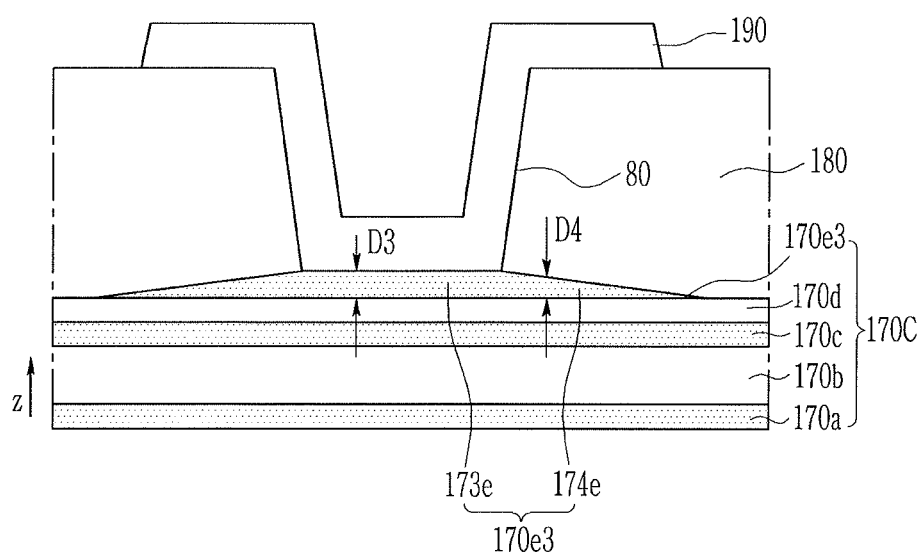

The cross-sectional structure shown in FIG. 8 to FIG. 10 schematically represents a structure in which the third conductive layer 170 and the fourth conductive layer 190 are in contact with each other through the contact hole of the passivation layer 180. For example, the cross-sectional structure may be the cross-sectional structure shown in FIG. 2 and FIG. 3 as above-described, and a contact hole 80 of the passivation layer 180 may be one of the above-described contact holes 81, 82, and 88.

Referring to FIG. 8, the third conductive layer 170A according to an exemplary embodiment may be substantially the same as the third conductive layer 170 of the above-described exemplary embodiment. However a fifth layer 170e1 corresponding to the fifth layer 170e may be included. The fifth layer 170e1 may not be disposed on the whole of the third conductive layer 170A. Instead, the fifth layer 170e1 may have a smaller plane area than the first layer 170a, the second layer 170b, the third layer 170c, and the fourth layer 170d. For example, the fifth layer 170e1 may be substantially disposed in the area corresponding to the contact hole 80, instead of being under the passivation layer 180 disposed on the third conductive layer 170A. For example, the fifth layer 170e1 may be hardly disposed between the passivation layer 180 and the fourth layer 170d, such that the passivation layer 180 and the fourth layer 170d are in direct contact with each other in most areas.

Referring to FIG. 9, most of a third conductive layer 170B according to an exemplary embodiment may be the same as the above-described third conductive layer 170, except that a fifth layer 170e2 corresponding to the fifth layer 170e of FIG. 8 may be included. The fifth layer 170e2 may be disposed on most of the third conductive layer 170B. The fifth layer 170e2 may have different thicknesses depending on its position. For example, the fifth layer 170e2 may include a first portion 171e that is disposed in the area corresponding to the contact hole 80 and that does not overlap the passivation layer 180. The fifth layer 170e2 may further include a second portion 172e connected to the first portion 171e and disposed between the passivation layer 180 and the fourth layer 170d to overlap the passivation layer 180. A maximum thickness D2 of the second portion 172e may be less than a maximum thickness D1 of the first portion 171e.

Next, referring to FIG. 10, a fifth layer 170e3 included in a third conductive layer 170C according to an exemplary embodiment may be formed at a part of the third conductive layer 170C, like the fifth layer 170e1 of the third conductive layer 170A shown in FIG. 8. The fifth layer 170e3 may include a first portion 173e that is disposed in the area corresponding to the contact hole 80 such that the first portion 173e does not overlap the passivation layer 180. A second portion 174e connected to the first portion 173e may be disposed near the contact hole 80, and may overlap the passivation layer 180. The first portion 173e may be mainly disposed in the area corresponding to the contact hole 80 in which the passivation layer 180 is removed, similar to the fifth layer 170e1 of FIG. 8 as above-described. The second portion 174e may be disposed between the passivation layer 180 and the fourth layer 170d, similar to the fifth layer 170e2 of FIG. 9, however the thickness thereof may be varied depending on its position. Most of the thickness D3 of the first portion 173e may be constant. The thickness D4 of the second portion 174e may gradually decrease in relation to a distance from the edge of the contact hole 80 and a distance from the first portion 173e. The thickness D4 of the second portion 174e may be less than the thickness D3 of the first portion 173e. The second portion 174e may be absent beyond an area at a certain distance from the edge of the contact hole 80, such the passivation layer 180 and the fourth layer 170d in the area beyond the certain distance may be in direct contact.

Now, the manufacturing method of the display panel 1000 according to an exemplary embodiment, particularly the manufacturing method of the third conductive layer and the passivation layer 180, will be described with reference to FIG. 8 to FIG. 10 along with FIG. 1 to FIG. 3.

After forming the several layers including the third insulating layer 160 on the substrate 110, the first layer 170a, the second layer 170b, and the third layer 170c may be sequentially stacked on the third insulating layer 160. The fourth layer 170d, as a natural oxidation layer, may be formed on the third layer 170c after stacking the third layer 170c.

The material for the passivation layer 180, for example the organic material such as the polyimide-based resin, may be coated on the fourth layer 170d, and a photo process may be executed to form the plurality of contact holes 80, 81, 82, and 88 in the passivation layer 180. Inn a curing process for the passivation layer 180, at least part of the fourth layer 170d may be crystallized, thereby forming the fifth layers 170e, 170e1, 170e2, and 170e3 according to the exemplary embodiments. The curing process of the passivation layer 180 may be executed, for example, in a nitrogen ($N_2$) atmosphere at about 150 degrees (° C.) to about 400 degrees (° C.).

A display device according to an exemplary embodiment, for example, various display devices such as various tablets, mobile phones, televisions, and head mounted display devices, may include the display panel 1000 according to the above-described several exemplary embodiments.

By way of summation and review, a display panel may include a plurality of layers stacked on a substrate. The plurality of layers include various conductive layers and various insulating layers. Conductive layers that are different from each other may be in contact with each other for connecting electrical elements that are different from each other, thereby electrically connecting the electrical elements to each other.

Embodiments may prevent a voltage from being reduced by reducing contact resistance between different conductive layers Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof t as set forth in the following claims.

What is claimed is:

1. A display panel, comprising:
   a first conductive layer including a first layer, a second layer, a third layer, a fourth layer, and a fifth layer that are sequentially stacked, the first layer being electrically conductive with the fifth layer; and
   a second conductive layer disposed on the first conductive layer and in contact with the fifth layer, wherein
   the first layer and the third layer include a first metal,
   the second layer includes a second metal that is different from the first metal,
   the fourth layer includes the first metal and oxygen in a first composition ratio,
   the fifth layer includes the first metal and oxygen in a second composition ratio, and
   the first composition ratio and the second composition ratio are different from each other.

2. The display panel as claimed in claim 1, wherein:
   conductivity of the fifth layer is higher than conductivity of the fourth layer.

3. The display panel as claimed in claim 1, wherein:
   the first composition ratio is a ratio of an atom percent of the first metal to an atom percent of oxygen in the fourth layer,
   the second composition ratio is a ratio of an atom percent of the first metal to an atom percent of oxygen in the fifth layer, and
   the second composition ratio is smaller than the first composition ratio.

4. The display panel as claimed in claim 3, wherein:
   the first composition ratio is more than 1.0 and less than or equal to 2.0, and
   the second composition ratio is equal to or more than 0.8 and less than or equal to 1.0.

5. The display panel as claimed in claim 3, wherein an atom percent of oxygen included in the third layer is lower than the atom percent of oxygen included in the fourth layer.

6. The display panel as claimed in claim 5, further comprising:
a substrate under the first conductive layer; and
an underlying layer between the substrate and the first conductive layer, wherein
the first layer contacts the underlying layer.

7. The display panel as claimed in claim 6, wherein the atom percent of oxygen included in the third layer is between the atom percent of oxygen included in the fourth layer and an atom percent of oxygen included in the first layer.

8. The display panel as claimed in claim 6, wherein a thickness of the second layer is greater than a thickness of the third layer or the first layer.

9. The display panel as claimed in claim 3, wherein the first metal is titanium (Ti).

10. The display panel as claimed in claim 3, further comprising:
an insulating layer between the first conductive layer and the second conductive layer, wherein
the insulating layer includes a contact hole on the first conductive layer,
the fifth layer includes a first portion and a second portion, the first portion being located corresponding to the contact hole and not overlapping the insulating layer, the second portion being connected to the first portion and located between the insulating layer and the fourth layer, and
a thickness of the second portion is equal to or less than a thickness of the first portion.

11. The display panel as claimed in claim 10, wherein the thickness of the second portion gradually decreases in relation to a distance from the first portion.

12. The display panel as claimed in claim 3, further comprising:
an insulating layer between the first conductive layer and the second conductive layer, wherein
the insulating layer includes a contact hole on the first conductive layer, and
the fifth layer is located at an area corresponding to the contact hole.

13. The display panel as claimed in claim 3, wherein:
one of the fourth layer and the fifth layer is amorphous, and
another of the fourth layer and the fifth layer is crystalline.

14. The display panel as claimed in claim 1, further comprising:
a substrate under the first conductive layer;
an active layer between the substrate and the first conductive layer, the active layer including a semiconductor material;
at least one first insulating layer between the active layer and the first conductive layer; and
a second insulating layer between the first conductive layer and the second conductive layer, wherein
the first conductive layer is electrically connected to the active layer through a first contact hole included in the at least one first insulating layer, and
the second conductive layer contacts the fifth layer through a second contact hole included in the second insulating layer.

15. The display panel as claimed in claim 1, wherein the second conductive layer comprises:
a first layer disposed directly on the fifth layer of the first conductive layer,
a second layer disposed on the first layer of the second conductive layer, and
a third layer disposed on the second layer of the second conductive layer.

16. The display panel as claimed in claim 15, wherein
the first layer of the second conductive layer and the third layer of the second conductive layer include a transparent conductive material, and
the second layer of the second conductive layer includes a third metal that is different from the first metal and the second metal.

17. The display panel as claimed in claim 16, wherein
the first metal is titanium (Ti),
the second metal is aluminum (Al), and
the third metal is silver (Ag).

18. The display panel as claimed in claim 17, wherein
the fourth layer is titanium oxide of TiOx, and
the fifth layer is titanium oxide of TiO.

19. The display panel as claimed in claim 18, wherein the transparent conductive material is ITO.

20. The display panel as claimed in claim 1, wherein the second layer of the first conductive layer is in direct physical contact with the third layer of the first conductive layer.

* * * * *